United States Patent [19]

Matsuo et al.

[11] Patent Number: 4,880,488
[45] Date of Patent: Nov. 14, 1989

[54] FILM PEELING METHOD AND APPARATUS

[75] Inventors: Takao Matsuo, Hyogo; Fumio Hamamura, Kanagawa; Shigeo Sumi, Saitama, all of Japan

[73] Assignee: Somar Corporation, Tokyo, Japan

[21] Appl. No.: 258,045

[22] Filed: Oct. 14, 1988

Related U.S. Application Data

[63] Continuation of Ser. No. 898,162, Aug. 18, 1986, abandoned.

[30] Foreign Application Priority Data

| Aug. 16, 1985 | [JP] | Japan | 60-180842 |
| Aug. 16, 1985 | [JP] | Japan | 60-180843 |
| Aug. 16, 1985 | [JP] | Japan | 60-180844 |
| Dec. 13, 1985 | [JP] | Japan | 60-280796 |

[51] Int. Cl.$^4$ .............................................. B32B 31/18
[52] U.S. Cl. .................................... 156/344; 156/584
[58] Field of Search ............................ 156/344, 584

[56] References Cited

U.S. PATENT DOCUMENTS

| 3,883,390 | 5/1975 | Cohen et al. | 156/584 |
| 3,951,727 | 4/1976 | Greenberg | 156/584 |
| 4,631,103 | 12/1986 | Ametani | 156/344 X |
| 4,631,110 | 12/1986 | Tsumura et al. | 156/584 |
| 4,770,737 | 4/1988 | Seki | 156/584 |
| 4,798,646 | 1/1989 | Sumi | 156/344 X |

Primary Examiner—Robert A. Dawson
Attorney, Agent, or Firm—Sughrue, Mion, Zinn, Macpeak & Seas

[57] ABSTRACT

An apparatus for peeling a film from a substrate is disclosed which comprises: film peeling guide members for setting a direction of peeling of the film; peeling members for peeling off a part of the film and sticking the part onto the film peeling guide members; a film conveying subsystem for supporting the film stuck onto the film peeling guide members and removing the film out of the apparatus; and guide member moving mechanism for causing the film peeling guide members to change their angular positions. Also, a related method is disclosed herein.

17 Claims, 8 Drawing Sheets

FILM PEELING METHOD AND APPARATUS

This is a continuation of application Serial No. 06/898,162 filed 8/18/86 and now abandoned.

BACKGROUND OF THE INVENTION

This invention relates to a film peeling technique, and more particularly to a technique which can be effectively employed to peel a protective film from a substrate.

In a printed circuit board used in an electronic device such as a computer, a predetermined circuit is formed with copper on one or both sides of an insulated substrate. A printed circuit board of this type can be manufactured as follows: First, a laminate consisting of a photosensitive resin (photo-resist) layer and a translucent resin film (protective film) for protecting the photosensitive resin layer is thermally formed on the conductive layer of the insulated substrate under pressure. Thereafter, a circuit pattern film is laid over the laminate, and the photosensitive resin layer is exposed to light through the circuit pattern film and the translucent resin film for a predetermined period of time. After peeling the translucent resin film, the photosensitive resin layer thus exposed to light is subjected to developing to form an etching mask pattern. Then, the unnecessary parts of the conductive layer are removed by etching, and the remaining photosensitive resin is peeled off, to obtain a printed circuit board having the predetermined circuit pattern.

When, in the manufacture of the printed circuit board, the photosensitive resin layer exposed to light is developed, it is necessary to peel the photosensitive resin film off. The peeling operation is manually carried out. As the film is considerably thin, the printed circuit board may be damaged or broken if the force of peeling the photosensitive resin film off is not uniform. That is, the person peeling the film off must be clever with his fingers and skillful.

Therefore, it takes a relatively long time to peel the translucent resin film, an therefore the time required for manufacturing the printed circuit board is increased as much.

The above-described problems and other problems to be solved by the invention and novel features of the invention will become more apparent when read the following description in conjunction with the accompanying drawings.

OBJECTS AND SUMMARY OF THE INVENTION

An object of the invention is to provide a film peeling method of peeling a film from a substrate in which, when a film such as a translucent resin film is peeled from the substrate, the shifting of the peeling position and the changing of the peeling stress and prevented, and an apparatus for practicing the method.

Another object of the invention is to provide a film peeling method of peeling a film from a substrate in which the peeling operation can be achieved without damaging the photosensitive resin layer on the substrate, and the apparatus for practicing the method.

A further object of the invention is to provide a film peeling method of peeling a film from a substrate in which, when a film such as a photosensitive resin film is peeled off, the shifting of the peeling position and the changing of the peeling stress are prevented, and the peeling operation is automatically carried out without damaging the photosensitive resin layer, and an apparatus for practicing the method.

A still further object of the invention is to provide a film peeling method of peeling a film from a substrate in which the time required for peeling a film such as a photosensitive resin film is significantly reduced, and an apparatus for practicing the method.

Typical ones of the inventions disclosed by the present application are briefly described as follows:

The first invention is a film peeling method of peeling a film from a substrate whose specific feature resides in that a film peeling guide member is employed which is adapted to set the direction of peeling a film from a substrate obtuse in angle with respect to the direction of conveyance of the substrate (being acute as viewed in the opposite direction).

The second invention is a film peeling apparatus for peeling a film from a substrate the specific feature of which resides in that the apparatus comprises: film raising means for raising a film from a substrate; a film peeling guide member arranged substantially perpendicular to the substrate, to set the direction of peeling of the film thus raised to a predetermined angle; and film peeling and conveying means for peeling and conveying the film thus raised by the film raising means.

The third invention is a film peeling apparatus for peeling a film from a substrate the specific feature of which resides in that the apparatus comprises: film raising means for raising a film from a substrate; a film peeling guide member arranged obtuse in angle with respect to the direction of conveyance of the substrate (being acute as viewed in the opposite direction) to set the direction of peeling of the film thus raised to a predetermined angle; and a film peeling and conveying means for peeling and conveying the film thus raised by the film raising means.

The fourth invention is a film peeling apparatus for peeling a film from a substrate the specific feature of which resides in that the apparatus comprises: film raising means for raising a film from a substrate; a peeling angle variable type film peeling guide member which can be arranged at an angle in a range of from an obtuse angle with respect to the direction of conveyance of the substrate (being an acute angle as viewed in the opposite direction) to substantially right angles, to set the direction of peeling of the film thus raised to a predetermined angle; and film peeling and conveying means for peeling and conveying the film thus raised by the film raising means.

The film raising means operates to raise a film such as a translucent resin film, and the film is peeled off the substrate under the condition the back surface of the film is abutted against the film peeling guide member. Therefore, the peeling force is uniformly and stably applied to the film.

Provided according to another aspect of the invention is a film peeling method of peeling a film from a substrate comprising the steps of: positioning film peeling guide members adapted to set the direction of peeling the film close to the substrate; peeling off a part of the film and sticking the part onto the film peeling guide members thus positioned close to the substrate; supporting the film thus stuck onto the film peeling guide members; supporting the film thus stuck onto the film peeling guide members; moving the film peeling guide members away from the substrate; and conveying the substrate while peeling off the film with the film peeling guide members thus moved away from the substrate.

Provided according to another aspect of the invention is a film peeling apparatus for peeling a film from a substrate which comprises: film peeling guide members for setting the direction of peeling of the film; peeling means for peeling off a part of the film and sticking the part onto the film peeling guide members; film conveying means for supporting the film stuck onto the film peeling guide members and removing the film out of the apparatus; guide member moving means for causing the film peeling guide members to approach the substrate and to move away from the substrate; and conveying means for conveying the substrate from which a part of the film has been peeled.

Provided according to still another aspect of the invention is a film peeling apparatus for peeling a film from a substrate, which comprises: film peeling guide members for setting the direction of peeling of the film; a fluid jetting mechanism for jetting fluid to peel off a part of the film and stick the part onto the film peeling guide members; film conveying means for supporting the film stuck onto the film peeling guide members; guide member moving means for causing the film peeling guide members to approach the substrate and to move away from the substrate; fluid jetting part moving means for causing the fluid jetting parts of the fluid jetting mechanism to approach the substrate and to move away from the substrate; and conveying means for conveying the substrate from which a part of the film has been peeled.

DESCRIPTION OF THE PREFERRED EMBODIMENTS

This invention will be described with reference to a device for peeling off the protective film of a printed circuit board to which the technical concept of the invention is applied.

In the accompanying drawings, like parts are designated by like reference numerals or characters.

Figure 1:
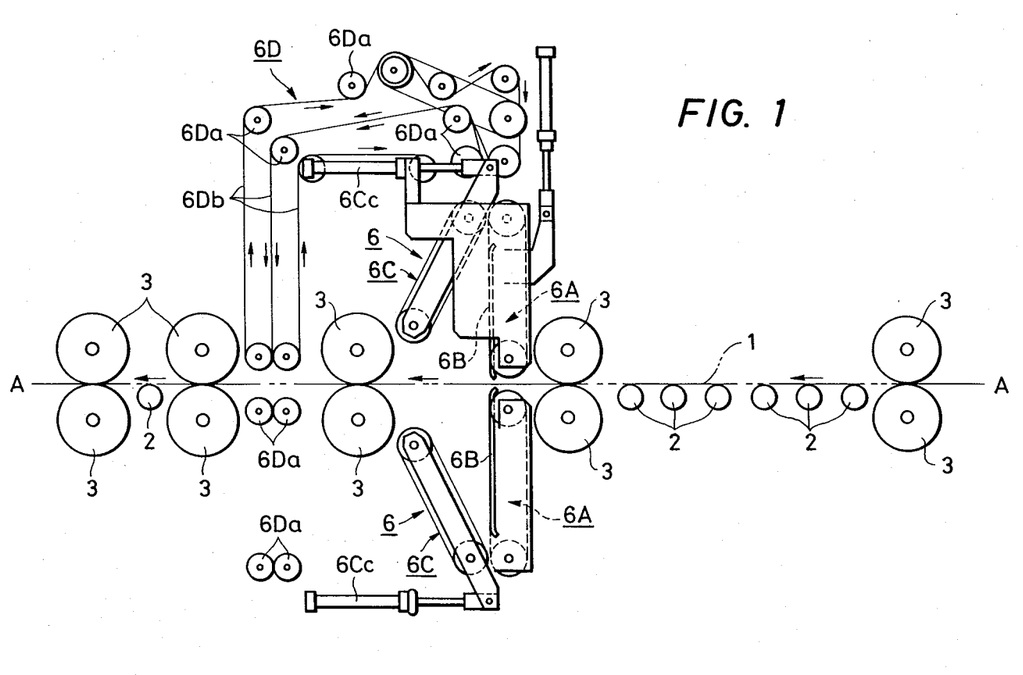
FIG. 1 is a sectional view outlining the arrangement of a protective film peeling and conveying mechanism for a printed circuit board which is a first embodiment of this invention.

FIG. 1 is a diagram outlining the arrangement of a mechanism of peeling and conveying the protective film of a printed circuit board which is one embodiment of the invention.

Figure 2:
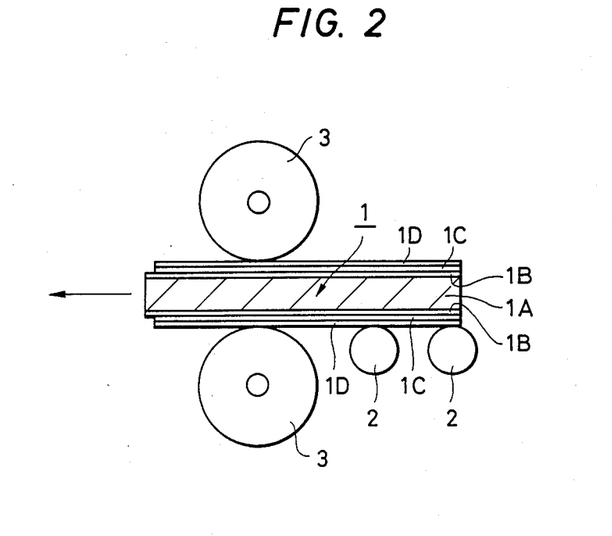
FIG. 2 is an enlarged perspective view showing essential components of the conveying mechanism in FIG. 1.

In the embodiment, the mechanism of peeling and conveying the protective film of a printed circuit board mainly comprises: conveying rollers 2 for conveying printed circuit boards 1; and conveyance control rollers 3. As shown in FIG. 2, in the printed circuit board, copper conductive layers 1B are formed on both sides of an insulated substrate 1A. On each of the copper conductive layers 1B, a laminated layer consisting of a photosensitive resin layer 1C and a translucent resin film (or protective film) 1D is formed. The photosensitive resin layer 1C has been exposed to have a predetermined wiring pattern.

The aforementioned conveying rollers 1 and conveyance control rollers 3 are so arranged that the printed circuit board 1 is conveyed in the direction of the arrow on a conveying path indicated by line A—A in FIG. 1.

Figure 3:
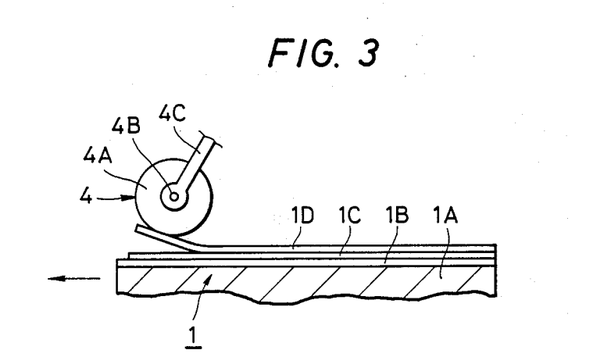
FIG. 3 is a diagram for a description of the principle of the embodiment.
Figure 4:
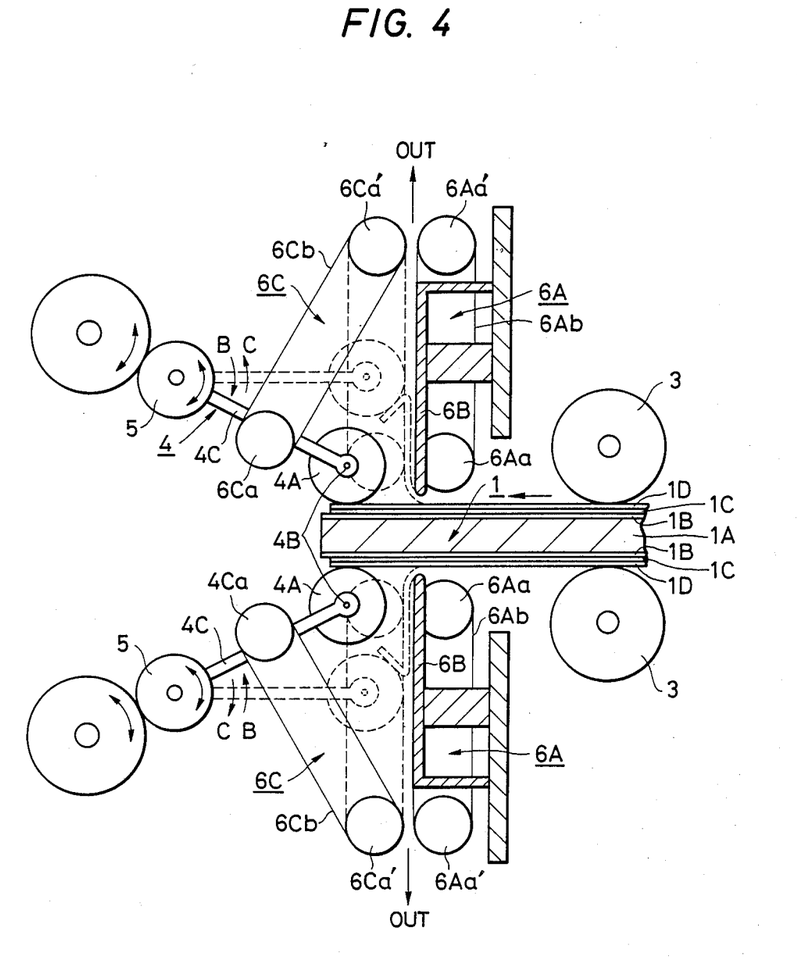
FIG. 4 is an enlarged sectional view outlining the arrangement of essential components of the peeling and conveying mechanism.
Figures 5, 6:
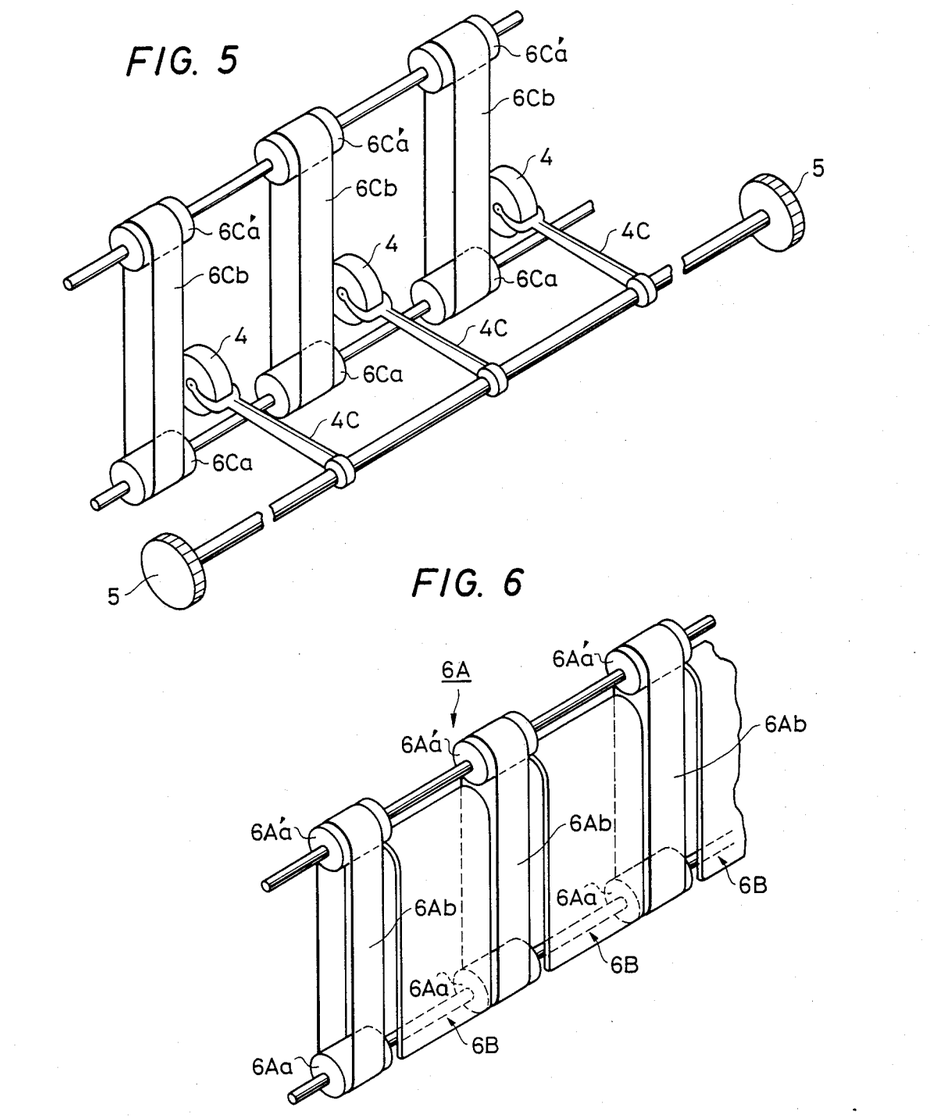
FIG. 5 is a perspective view outlining the arrangement of the film peeling mechanism shown in FIG. 1.
FIG. 6 is a perspective view outlining essential components of stationary belt conveyors and film peeling guide members in FIG. 1.

The aforementioned protective film lifting mechanism lifts a part of the translucent resin film 1D when the top edge of the printed circuit board comes to a predetermined position as shown in FIG. 3. More specifically, an adhesive roller unit 4 is pushed against the translucent resin film 1D of the printed circuit board 1 so that it adheres to the resin film 1D, and under this condition the adhesive roller unit 4 is moved upwardly to positively lift a part of the translucent resin film 1D. Each adhesive roller unit 4, as shown in FIG. 4, comprises: a cylindrical roller on the cylindrical surface of which an adhesive material layer 4A is formed; and a movable arm 4C with a rotating shaft 4B. The arm 4C is used to move the adhesive roller 4 up and down by the rotation of a gear mechanism 5. As shown in FIG. 5, the arms 4C are interposed between movable conveying belts 6Cb.

As shown in FIG. 4, the arms 4C are moved in the direction of the arrow B so that the adhesive material layers 4A are brought into contact with the top end portion of the translucent resin films 1D. Under this condition, the printed circuit board 1 is conveyed in the direction of conveyance by the conveyance control rollers 3 while the arms 4C are swung in the direction of the arrow C, causing the adhesive material layers 4A to pull up the translucent resin films 1D. In this case, the photosensitive resin layers 1C will never be peeled off the conductive layers 1B because the force of adhesion of the photosensitive resin layer 1C and the conductive layer 1B and that of the insulating substrate 1A and the conductive layer 1B are larger than the force of adhesion of the translucent resin film 1D and the photosensitive resin layer 1C.

As is apparent from the above description, the adhesive roller units 4 simple construction can raise parts of the translucent resin films 1D. In this case, the part of each translucent resin film 1D can be raised merely by abutting the respective adhesive roller unit 4 against the translucent resin film 1D. Therefore, no mechanical impact is applied to the printed circuit board, and the photosensitive resin layers 1C will never be damaged or broken.

As the adhesive roller units 4 are provided along the path of conveyance of the printer circuit board 1, the parts of the translucent resin films 1D can be automatically peeled therefrom.

Each peeling conveying mechanism 6, as shown in FIGS. 1 and 4, comprises: a stationary belt conveyor 6A; a film peeling guide member 6B; a movable belt conveyor C; and a film removing conveying belt mechanism 6D.

As shown in FIGS. 1, 4 and 6 (perspective view showing essential components), each stationary belt conveyor 6A comprises; a pair of rollers 6Aa and 6Aa′, and an endless belt 6Ab laid over the rollers 6Aa and 6Aa′

Each movable belt conveyor 6C, as shown in FIGS. 1, 4 and 5, comprises: a pair of rollers 6Ca and 6Ca′; and an endless belt laid over these rollers 6Ca and 6Ca′. The movable belt conveyors 6C are so designed that each of the conveyors 6C is driven by an air cylinder 6Cc through the roller 6Ca to approach or contact the belt 6Ab of the stationary belt conveyor 6A or the film peeling guide member 6B. The movable belt conveyors 6c operate to positively hold on the film peeling guide members 6B the translucent resin films 1D peeled off by the adhesive rollers 4, respectively.

Each translucent resin film 1D peeled off by the adhesive roller 4 is held by the stationary belt conveyor 6A and the movable belt conveyor 6C (as indicated by the dotted lines in FIG. 4), and the pair of rollers 6Aa and 6Aa′ and the pair of rollers 6Ca and 6Ca′ are driven so that the translucent resin film is continuously peeled off and removed.

Each of the a film peeling guide members 6B is provided in the housing of the film peeling device on the respective stationary belt conveyor 6A to support the belt 6Ab.

The film peeling guide member 6B is so designed that, in order to prevent the variation of the peeling position of the translucent resin film 1D, the variation of peeling stress thereof and to prevent the photosensitive resin layer 1C from being damaged or broken, the film peeling guide member guides the translucent resin film 1D such that the peeling angle of the latter 1D is obtuse with respect to the direction of conveyance of the printed circuit board 1. That is, the speed of peeling and conveying the translucent resin film 1D is made equal to the speed of conveyance of the printed circuit board 1, or at the start of peeling the speed of conveyance of the printed circuit board is made higher than the speed of peeling and conveying the translucent resin film 1D, so that the peeling angle of the translucent resin film 1D is obtuse with respected to the direction of conveyance of the printed circuit board 1.

The end of each film peeling guide member 6B is spaced from the printed circuit board 1 to the extent that it is not rubbed by the printed circuit board 1.

The end of each film peeling guide member is arcuate, with radius of curvature, of not more than 3 mm.

The film peeling guide member 6B is designed as described above, to stabilize the peeling position and to apply uniform peeling stress to the translucent resin film 1D and the photosensitive resin layer 1C.

Figure 7:
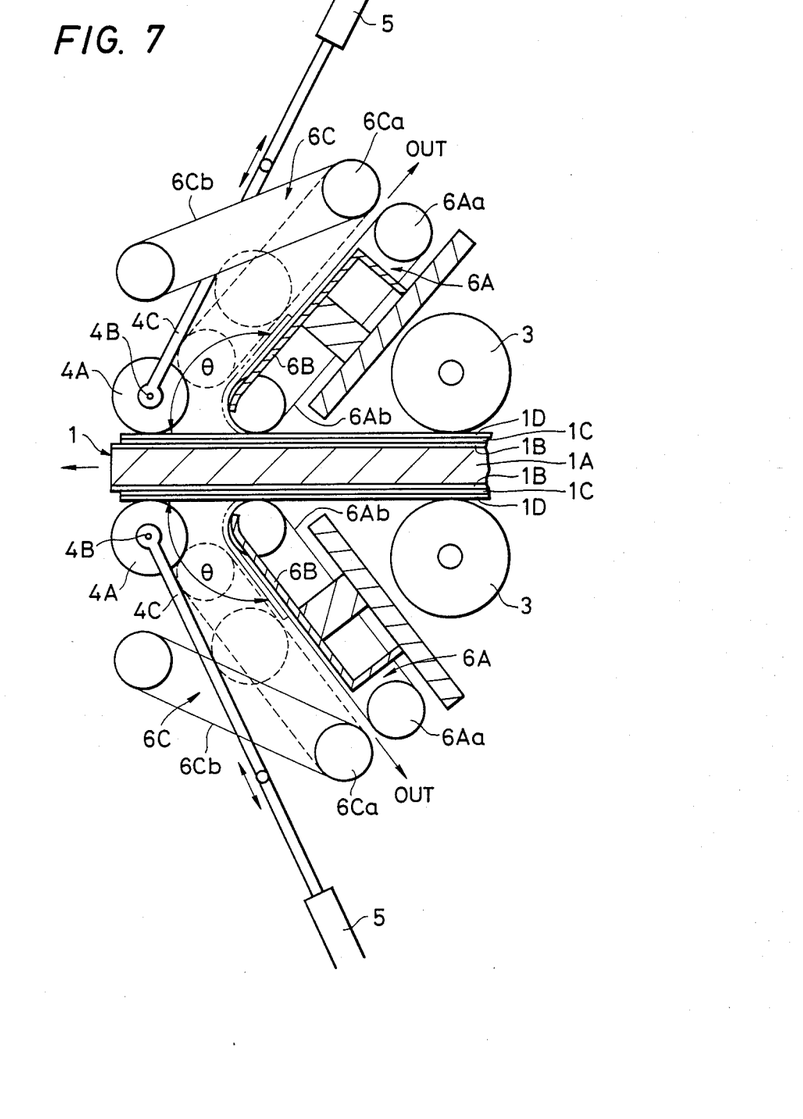
FIG. 7 is an enlarged sectional view outlining the arrangement of essential components of one modification of the peeling and conveying mechanism of FIG. 1.

If the apparatus is so modified as shown in FIG. 7 that the peeling angle of the translucent resin film 1D with respect to the direction of conveyance of the printed circuit board 1D is obtuse whereby the speed of peeling and conveying of the translucent resin film 1D is substantially equal to the speed of conveyance of the printed circuit board 1, more uniform stress can be applied to the translucent resin film 1D and the photosensitive resin layer 1C.

Figure 8:
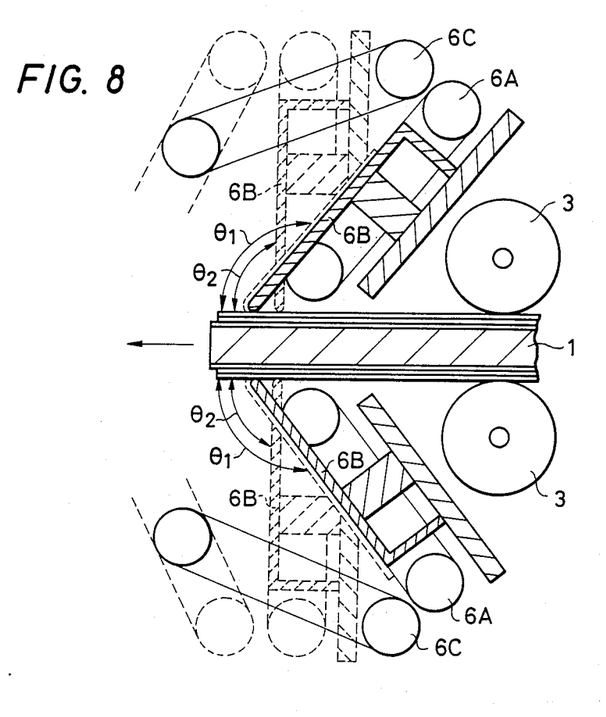
FIG. 8 is an enlarged sectional view outlining the arrangement of essential components of another modification of the peeling and conveying mechanism of FIG. 1.

In addition, if each film peeling guide member 6B is so designed that, as shown in FIG. 8, the peeling angle $\theta$ (as viewed from the direction of conveyance of the board 1) of the translucent resin film 1D can be set to a value in a range of from an obtuse angle $\theta_1$ to substantially right angles $\theta$ with respect to the direction of conveyance of the printed circuit board 1, an optimum peeling angle $\theta$ can be set according to the peeling and conveying speed and the peeling stress.

As each of the peeling and conveying mechanism 6 is made up of a stationary belt conveyor 6A, the film peeling guide member 6B and the movable belt conveyor 6C as was described above, the translucent resin film 1D raised by the adhesive roller 4 is guided by the film peeling guide member 6B and conveyed while being held by the stationary belt conveyor 6A and the movable belt conveyor 6C, so that it is moved out in the direction of the arrow "OUT" in FIG. 4, 7 or 8.

Each of the film removing conveying belt mechanisms 6D, as shown in FIG. 1, comprises a plurality of rollers 6Da and a pair of belts 6Db. The film removing conveying belt mechanism 6D is so designed as to remove the upper layer namely, the translucent resin film 1D of the printed circuit board 1.

In each of the movable belt conveyor 6C, instead of the air cylinder 6Cc an electromagnetic solenoid or hydraulic cylinder may be employed.

The film peeling devices are arranged in the path of conveyance of the printed circuit board 1 as described above. The following operations are automatically carried out: raising a part of each translucent resin film 1D of the printed circuit board 1, peeling and conveying the translucent resin film 1D with the peeling and conveying mechanism 6, and positively removing the translucent resin film 1D thus peeled.

After the translucent resin films 1D have been peeled off the printed circuit board 1 by the abovedescribed film peeling devices, the printed circuit around 1 is transferred by the conveyance control rollers 3 and the conveying rollers 2 to a developing unit where the photosensitive resin layers 1C are subjected to developing.

While the invention has been described with reference to its preferred embodiments, it should be noted that the invention is not limited thereto or thereby. That is, it will be obvious to those skilled in the art that various changes and modifications can be made therein without departing from the invention.

Figure 9:
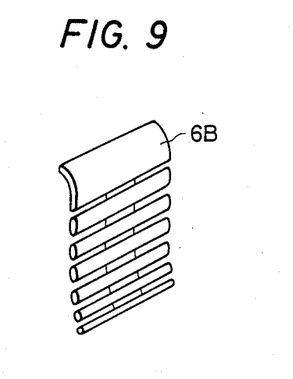
FIG. 9 is a perspective view outlining arrangement of one modification of the film peeling guide member.

For instance, the film peeling guide member 6B may be replaced by one which is formed by arranging a plurality of bar-shaped members in the form of a duckboard as shown in FIG. 9. In this example, the top bar-shaped member is arcuate in section, being small in curvature radius.

Furthermore, the film peeling and conveying means may be one in which rotating rollers are employed in combination, one in which stationary belts are used in combination, one in which the film are wound on rotating rollers, or one in which the force of suction of sucking disks are utilized for the peeling and conveying operation.

While the invention have been described with reference to the case where the films are peeled off the printed circuit board, it is obvious that the technical concept of the invention can be applied, for instance, to the case of removing protective films from dressed boards which are used as building materials.

As is apparent from the above description, according to the invention, the direction of peeling the thin film from the substrate is made obtuse with respect to the direction of conveyance of the substrate (being acute as viewed in the opposite direction) with each of the film peeling guide members, whereby the films such as the translucent resin films and the photosensitive resin layers are applied with uniform peeling stress and the peeling positions are stabilized. Accordingly, the difficulties that, during the operation of peeling the film such as the translucent resin films, the peeling position is shifted or the peeling stress is changed can be prevented. Furthermore, the peeling can be achieved without damaging the photosensitive resin layers.

The apparatus is so designed that a part of the film is raised from the substrate and the film thus raised is peeled and conveyed in a direction substantially perpendicular to the substrate. Therefore, uniform peeling stress is applied to the films such as the translucent resin films and the photosensitive resin layers and the peeling positions are stabilized. Accordingly, the difficulties that arise during the operation of peeling the film, such as the peeling position shifting or the peeling stress changing can be eliminated. In addition, the peeling can be automatically accomplished without damaging the photosensitive resin layers.

As the films can be peeled from the substrate readily and instantaneously, the time requires for peeling the film from the substrate can be reduced.

A modification of the film removing mechanism 6 will be explained which comprises: a stationary belt conveyor 6A; film peeling guide members 6B; a movable belt conveyor 6C; and a film removing conveying belt mechanism 6D.

Figure 10:
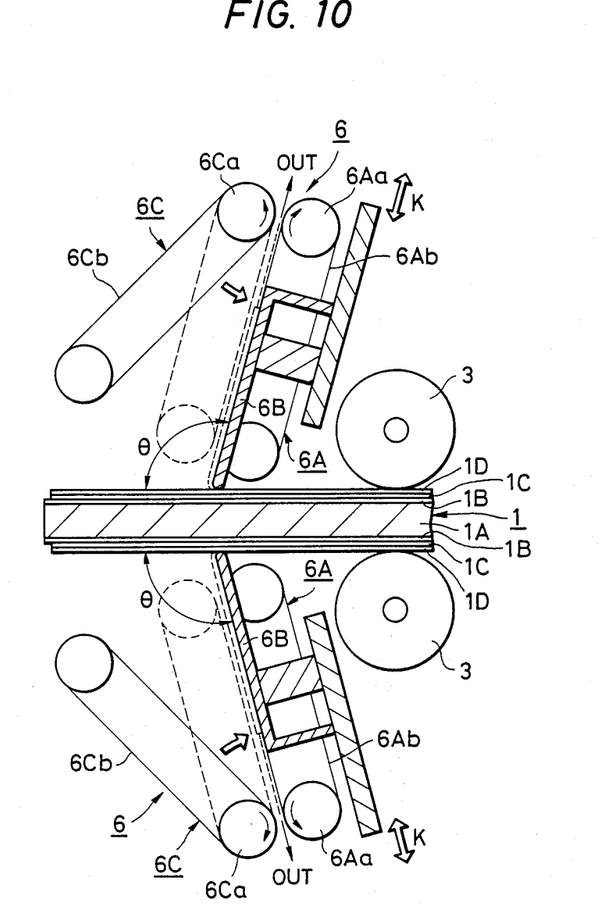
FIG. 10 is an enlarged sectional view outlining the arrangement of essential components of still another modification of the peeling and conveying mechanism of FIG. 8.
Figure 11:
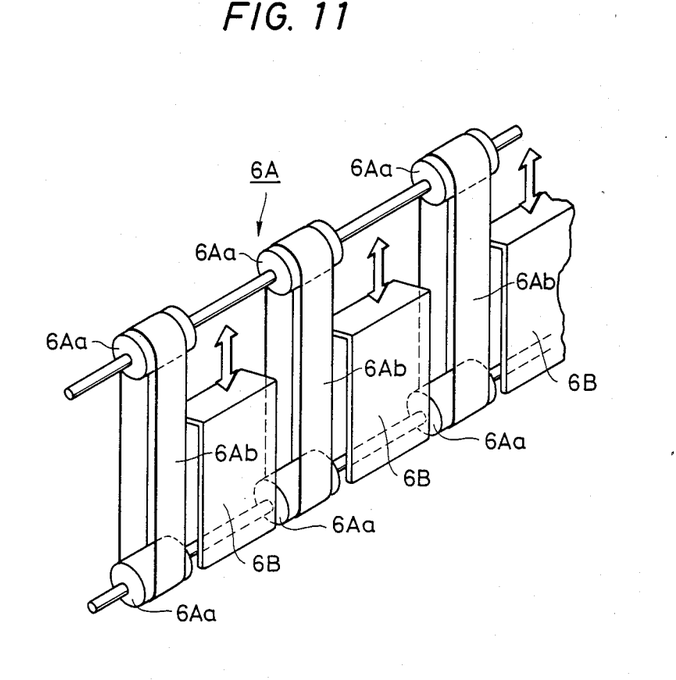
FIG. 11 is a perspective view of the mechanism shown in FIG. 10.

The stationary belt conveyor 6A, as shown in FIGS. 10 and 11 (a perspective view showing essential components), comprises a plurality of pairs of rollers 6Aa, and a plurality of belts 6Ab laid over the rollers 6Aa.

The movable belt conveyor 6C, as shown in FIGS. 1 and 8, comprises a pair of rollers 6Ca, and a belt 6Cb laid over the rollers 6Ca. The movable belt conveyor 6C is so designed that it is swung about one of the rollers 6Ca by an air cylinder 6Cc so as to approach or contact the belts 6Ab of the stationary belt conveyor 6A or the film peeling guide members 6B.

The stationary belt conveyor 6A and the movable belt conveyor 6C are so designed that the movable belt conveyor 6C (at the position indicated by the dotted lines) supports the translucent resin film 1D in cooperation with the stationary belt conveyor 6A which has been partially peeled off by the fluid jetting mechanism 5, which the rollers 6Aa and the rollers 6Ca are driven, so that the translucent resin film 1D is peeled off and removed out of the peeler.

The aforementioned film peeling guide members 6B are provided on the frame of the film peeling device which is on the side of the stationary belt conveyor 6A, and are disposed between the belts 6Ab.

The film peeling guide members 6B are so designed in construction as to prevent the occurrence of the difficulties that, when the translucent resin film 1D is peeled off, the peeling position is varied, the peeling stress becomes non-uniform, and the photosensitive resin layer 1C is damaged or broken, and to guide the translucent resin film 1D in the film peeling direction. That is, the film peeling guide members 6B are so designed that the peeling angle $\theta$ of the translucent resin film 1D raised (which is the angle formed between the translucent resin film 1D which is to be peeled off and the same translucent resin film 1D which has been peeled off) is a right angle to an obtuse angle (90° to 150°, preferably about a right angle) with respect to the board 1.

Each of the film peeling guide members 6B is positioned close to the board 1 to the extent that its end does not rub the board 1, and the guide member 6B is moved in the direction of the arrow K so that, when the board 1 is conveyed, the photosensitive resin layer 1C may not be damaged.

The guide members 6B are moved, for instance, by a servo motor, an air cylinder or the like is synchronization with the peeling mechanism. Furthermore, the film peeling guide members 6B are so designed that they are moved when the translucent resin film 1D is supported by the stationary belt conveyor 6A and the movable belt conveyor 6C.

The film peeling device may be so modified that the peeling angle $\theta$ of the film peeling guide members 6B can be changed when necessary.

The end portion of each of the film peeling devices 6B is arcuate in section, or small in the radius of curvature, e.g., 3 mm or less in the radius of curvature as in the mechanism shown in FIG. 8.

The film peeling guide members 6B thus provided stabilize the peeling position, and allow the application of uniform peeling stress to the translucent resin film 1D and the photosensitive resin layer 1C.

As was described above, the positions of the film peeling guide members 6B can be changed. Therefore, the film peeling guide members 6B can be positioned closed to the board 1 so that the peeling means effectively acts on the entire peeling surface of the translucent resin film 1D from the end of the board 1 to the film peeling guide members 6B, with the results that the initial peeling effect is improved, and the translucent resin film 1D can be positively stuck onto the film peeling guide members 6B. On the other hand, where the film peeling guide members 6B are moved away from the board 1, the photosensitive resin film 1C can be protected from damage when the board 1 is conveyed. Even if some of the gaps formed by the protruded pressing members 4A are unsatisfactory, the transparent resin film 1D can be peeled off without fail.

Each of the film removing mechanisms 6 is made up of the stationary belt conveyor 6A, the film peeling guide members 6B, and the movable belt conveyor 6C as was described above. Therefore, the translucent resin film 1D partially peeled off by the peeling means is guided by the film and supported by the stationary belt conveyor 6A and the movable belt conveyor 6C, as a result of which the translucent resin film 1D is conveyed while being peeled off, and removed in the direction of removal, or in the direction of the arrow OUT.

Since the film conveying mechanism 6 are provided in the board conveyance path, the translucent resin films 1D peeled off by the peeling means can be positively and automatically removed from the peeler. Therefore, the time required for removing the translucent resin films from the board can be greatly shortened.

After the translucent resin films 1D are peeled off by means of the peeling means and the film conveying mechanism 6, the board 1 is delivered to a developing unit by the conveyance control rollers 3 and the conveying rollers 3, where the photosensitive resin layers 1C are subjected to developing.

While there has been described in connection with the preferred embodiment of this invention, the invention is not limited thereto or thereby, and it will be obvious to those skilled in the art that various changes and modifications may be made therein without departing from the invention, and it is aimed, therefore, to cover in the appended claims all such changes and modifications as fall within the true spirit and scope of the invention.

We claim:

1. A film peeling apparatus for peeling a film substrate;
    a film raising means for raising a film from a substrate;
    a film peeling guide member arranged substantially perpendicular to said substrate, to set the direction of peeling of said film thus raised to predetermined angle; and
    film peeling and conveying means for peeling and conveying said film thus raised by said film raising means, wherein at the beginning of peeling said film, said substrate is conveyed at a speed greater than the speed at which said film is conveyed.

2. a film peeling apparatus for peeling a film from a substrate, comprising:
    film raising means for raising a film from a substrate;
    a variable film peeling guide member positioned at an angle in a range from an obtuse angle with respect to the direction of conveyance of said substrate to a substantially right angle with respect thereto; and
    a film peeling and conveying means for peeling and conveying said film thus raised by said film raising means, wherein at the beginning of peeling said film, said substrate is conveyed at a speed greater than the speed at which said film is conveyed.

3. A film peeling apparatus as claimed in claim 1 or 2, wherein said film peeling and conveying means comprises: a stationary belt conveyor having said film peeling guide member; and a movable belt conveyor for holding said film attached to said film peeling guide member, to peel and convey said film.

4. A film peeling apparatus as claimed in claim 1 or 2, wherein said film peeling guide member is so arranged that there is a small gap between said film peeling guide member and said substrate.

5. A film peeling apparatus as claimed in claim 1 or 2, wherein the end portion of said film peeling guide member is arcuate in section, having a small radius of curvature.

6. A film peeling apparatus as claimed in claim 1 or 2, wherein said film guide member is angularly movable.

7. A film peeling apparatus as claimed in claim 1 or 2, wherein said film guide member is linearly movable.

8. A film peeling method of peeling a film from a substrate comprising the steps of:
    positioning film peeling guide members, adapted to set a direction of peeling of said film, close to said substrate;
    peeling off a part of said film and sticking said part onto said film peeling guide members thus positioned close to said substrate;
    supporting said film stuck onto said film peeling guide members;
    moving said film peeling guide members away from said substrate; and
    conveying said substrate while peeling off said film with said film peeling guide members thus moved away from said substrate, wherein at the beginning of peeling said film, said substrate is conveyed at a speed greater than the speed at which said film is conveyed.

9. A film peeling apparatus for peeling a film from a substrate comprising:
    film peeling guide members for setting direction of peeling of said film;
    peeling means for peeling off a part of said film and sticking said part onto said film peeling guide members;
    film conveying means for supporting said film stuck onto said film peeling guide members and removing said film out of said apparatue; and
    guide member moving means for causing said film peeling guide members to approach said substrate and to move away from said substrate, wherein at the beginning of peeling said film, said substrate is conveyed at a speed greater than the speed at which said film is conveyed.

10. An apparatus as claimed in claim 4, in which said peeling means comprises a peeling mechanism for peeling said film with an adhesive member.

11. A film peeling method for peeling a film from a substrate comprising the steps of:
    lifting a portion of said film from said substrate with a film lifting means;
    moving said film lifting means to position said portion of said film along a film peeling guide member;
    conveying said substrate at a first speed;
    peeling said film in a direction determined by said film peeling guide member wherein the position of said film peeling guide member can be angularly changed, said film initially being peeled at a second speed slower than said first speed, and thereafter at said first speed; and
    removing said film lifting means from said film before said film is peeled away.

12. A film peeling method for peeling a film from a substrate comprising the steps of:
    lifting a portion of said film from said substrate with a film lifting means;
    moving said film lifting means to position said film along a film peeling guide member;
    conveying said substrate at a first speed;
    peeling said film in a direction determined by said film peeling guide member wherein the position of said film peeling guide member can be linearly changed, said film initially being peeled at a second speed slower than said first speed, and thereafter at said first speed; and
    removing said film lifting means from said film before said film is peeled away.

13. A film peeling method for peeling a film from a substrate comprising the steps of:
    lifting a portion of said film from said substrate with a film lifting means;
    moving said film lifting means to position said portion of said film along a film peeling guide member;
    conveying said substrate at a first speed;
    peeling said film in a direction determined by said film peeling guide member, said film initially being peel at a second speed slower than said first speed, and thereafter at said first speed; and removing said film lifting means from said film before said film is peeled away.

14. A film peeling method for peeling a film from a substrate as claimed in claim 13, wherein the position of said film peeling guide member is set substantially at a right angle with respect to the direction of conveyance of said substrate.

15. A film peeling method for peeling a film from a substrate as claimed in claim 12, wherein the position of said film peeling guide member is set substantially at a right angle with respect to the direction of conveyance of said substrate.

16. A film peeling method for peeling a film from a substrate as claimed in claim 13, wherein the step of peeling said film comprises supporting said film along said film peeling guide member with a film peeling and conveying member.

17. A film peeling method for peeling a film from a substrate as claimed in claim 16, wherein said film peeling and conveying member comprises a stationary belt conveyor having said film peeling guide member; and a movable belt conveyor for engaging said portion of said film at said film peeling guide member.

* * * * *